US012772791B2

(12) United States Patent
Kielban

(10) Patent No.: US 12,772,791 B2
(45) Date of Patent: Oct. 20, 2026

(54) SEMICONDUCTOR MANUFACTURING TOOL ALIGNMENT DEVICE AND METHOD

(71) Applicant: Diodes Incorporated, Plano, TX (US)

(72) Inventor: Bartosz Kielban, Greenock (GB)

(73) Assignee: Diodes Incorporated, Plano, TX (US)

( * ) Notice: Subject to any disclaimer, the term of this patent is extended or adjusted under 35 U.S.C. 154(b) by 426 days.

(21) Appl. No.: 18/438,054

(22) Filed: Feb. 9, 2024

(65) Prior Publication Data

US 2025/0096025 A1 Mar. 20, 2025

(30) Foreign Application Priority Data

Sep. 19, 2023 (GB) ...................................... 2314329

(51) Int. Cl.

| | |
|---|---|
| ***G01B 11/26*** | (2006.01) |
| ***G01B 11/27*** | (2006.01) |
| ***H10P 72/50*** | (2026.01) |
| ***H10P 72/76*** | (2026.01) |

(52) U.S. Cl.

CPC ............ *H10P 72/53* (2026.01); *G01B 11/272* (2013.01); *H10P 72/7602* (2026.01)

(58) Field of Classification Search

CPC ..... H10P 72/53; H10P 72/7602; G01B 11/272
See application file for complete search history.

(56) References Cited

U.S. PATENT DOCUMENTS

| | | | |
|---|---|---|---|
| 6,244,121 B1 | 6/2001 | Hunter | |
| 2017/0028560 A1 | 2/2017 | Senn | |
| 2019/0325601 A1 | 10/2019 | Chen et al. | |
| 2021/0074567 A1* | 3/2021 | Safrani | H10P 72/0606 |

FOREIGN PATENT DOCUMENTS

| | | | | |
|---|---|---|---|---|
| AT | 2009357245 A1 * | 6/2012 | G01H 1/00 |
| CN | 101537617 A | 9/2009 | |
| CN | 112534555 A | 3/2021 | |
| CN | 114450780 A | 5/2022 | |
| CN | 114914184 A | 8/2022 | |
| KR | 20070009600 A * | 1/2007 | H05K 1/184 |
| TW | 202209539 A | 3/2022 | |

OTHER PUBLICATIONS

International Search Report and Written Opinion for Application No. PCT/CN2023/137399, mailed on Mar. 13, 2024, 9 pages.
Office Action and Search Report for Taiwan Patent Application No. 112148076, mailed Sep. 25, 2024, 12 pages.

* cited by examiner

*Primary Examiner* — Mark Hellner
(74) *Attorney, Agent, or Firm* — AP3 Law Firm PLLC

(57) ABSTRACT

An alignment device for aligning a wafer handling robot in a wafer processing system includes a substrate having a through-hole. A sensor is mounted on a first surface of the substrate, and configured to capture, via the through-hole, information relating to a position of the alignment device in the wafer processing system. A transmitter is mounted on the first surface of the substrate and coupled to the sensor. The transmitter is configured to wirelessly transmit the information captured by the sensor. The transmitted information enables to determine whether the alignment device is within a threshold distance from a target position in the wafer processing system and to adjust the position of the alignment device. A method of aligning the wafer handling robot utilizing the alignment wafer, and a frame and method for calibrating the alignment wafer are also provided.

20 Claims, 11 Drawing Sheets

SEMICONDUCTOR MANUFACTURING TOOL ALIGNMENT DEVICE AND METHOD

CROSS-REFERENCE TO RELATED APPLICATIONS

This patent application claims priority to Great Britain Patent Application No. 2314329.0, filed on Sep. 19, 2023 and entitled "Semiconductor Manufacturing Tool Alignment Device," which is hereby incorporated by reference herein as if reproduced in its entirety.

TECHNICAL FIELD

The present disclosure relates to semiconductor manufacturing, and in particular, to an alignment device and method for aligning a wafer handling robot within a semiconductor manufacturing tool.

BACKGROUND

Manufacture of a semiconductor wafer frequently involves several processes, such as lithography, performed in multiple stages across different manufacturing machines or tools. Robots are used to move the semiconductor wafer between tools and load the semiconductor wafer in the correct position for each tool to process. It is important to ensure that the robots are accurately calibrated to position each wafer in the correct location within each tool to ensure the fabrication process is performed properly.

A dummy wafer, also referred to as an alignment wafer, is used to ensure mechanical alignment of the robots within each manufacturing tool of a wafer processing system. The dummy wafer provides an image of the manufacturing tool from the robot, and this image is used to provide information about the relative position of the robot and the dummy wafer within the manufacturing tool.

Conventional alignment wafers include wired connections between a camera on the dummy wafer and a remote display and a remote power source. The wires can be unsafe and are liable to being caught on moving parts of the robots or the manufacturing tools. Furthermore, due to the wires, intervention from a user is required to physically move the wafer at every stage of the robot handling setup and to physically remove the wafer to transfer it between tools. The conventional dummy wafers cannot be kept inside the manufacturing tools when the robots are calibrated or when the wafer is to be transferred between tools.

Due to the above limitations, photolithography semiconductor manufacturing tool robot handling setup can be extremely time consuming following mechanical or electrical part replacement, and is very labor intensive as it relies on the intervention of the user to physically move the dummy wafer. This also increases downtime leading to loss, and can require removal of parts of the tools for a user to access the dummy wafer within the manufacturing tools.

SUMMARY

Technical advantages are generally achieved, by embodiments of this disclosure which describe a semiconductor manufacturing tool alignment device and method.

It is an object of the disclosure to provide an alignment device which overcomes the problems associated with the Conventional dummy wafers.

Aspects and preferred features are set out in the accompanying claims.

According to a first aspect of the disclosure, there is provided an alignment device for use in a wafer processing system, the device comprising: a substrate configured to be handled by the wafer processing system; a sensor mounted on a first surface of the substrate and configured to capture information relating to a position of the alignment device relative to the wafer processing system; and a transmitter configured to wirelessly transmit the captured information to a receiver.

This allows the relative position between an alignment device and a wafer processing system to be determined, without using a wired device. Wafer processing system may refer to a system comprising one or more semiconductor or wafer processing modules each having a wafer or semiconductor processing tool. The alignment device may be held by a wafer handling robot, and thus the alignment device can be used to improve the alignment between the wafer handling robot and a semiconductor processing tool of the wafer processing system. This improves safety and removes the requirement for intervention from a user when setting up the wafer handling robot. This reduces photolithography semiconductor manufacturing tool robot handling setup time, and reduces system downtime.

The sensor may comprise a camera. The camera may be configured to receive radiation from the interior of the wafer processing module. This allows the camera to image the interior of the wafer processing module to determine information about the position of the alignment device and a wafer processing tool of the wafer processing system.

The alignment device may further comprise a reticle. The camera may be configured to capture an image through the reticle. This allows an improved and more reliable alignment of the wafer handling robot using the alignment device.

The alignment device may further comprise a reflecting element. The reflecting element may be located on the first surface of the substrate and at an acute angle to the first surface of the substrate. The reflecting element may be configured to direct radiation that is incident on the reflecting element from the interior of the wafer processing module to the camera. In examples, this allows the alignment device thickness to be reduced to allow the alignment device to be utilized in wafer processing modules, whilst also allowing a camera with increased focal length to be used.

The device may further comprise a radiation source configured to be incident on the interior of a semiconductor processing module of the wafer processing system. Interaction between radiation from the radiation source and the interior of a semiconductor processing module of the wafer processing system can be analyzed to determine information about the location of the wafer alignment device relative to the wafer processing tool. This allows the device to be used in dark wafer processing systems.

The substrate may further comprise a second surface. The first surface of the substrate and the second surface of the substrate may be parallel opposite surfaces. The camera may be configured to receive radiation from a substantially central point of the first surface or second surface of the substrate. This allows the device to capture information relating equally to a whole area of the wafer, and allows an image to be taken from the larger surfaces of the substrate.

The substrate may comprise an aperture extending from the first surface to the second surface. The camera may be configured to receive radiation passing through the aperture from the interior of the wafer processing module. This allows the camera to be located on an opposite side of the alignment device to the area that of the wafer processing module that is imaged.

The alignment device may comprise a protective film formed across the aperture. This protects the camera and other features of the alignment device from any contaminants in the wafer processing module. The reticle may be located on the protective film.

The alignment device may comprise a light source. The radiation source may comprise a light source. The light source may comprise one or more lights arranged around the aperture and configured to emit light from the second surface of the substrate. The light can illuminate the interior of the wafer processing module and therefore allows the camera to image the wafer processing module.

The device may further comprise a battery mounted on the first surface of the substrate. The battery may be configured to power the sensor and the transmitter.

The device may comprise a battery indicator configured to indicate a charge level of the battery.

The device may further comprise a cover located over the sensor and the transmitter, and configured to be attached to the substrate. The cover protects the components of the alignment device from contaminants within the wafer processing module of the wafer processing system, and prevents light from outside the alignment device from travelling to the camera, thereby reducing noise of the camera.

The alignment device may further comprise an antenna configured to wirelessly transmit a signal from the sensor to a receiver. The antenna may be located within the cover. Alternatively, the antenna may be located outside of the cover.

The device may comprise a battery indicator light configured to indicate a charge level of the battery. The cover may comprise a through-hole substantially aligned with the battery indicator light to allow the battery indicator light to be viewed from an outer surface of the cover.

The alignment device may further comprise a plurality of sidewalls surrounding the through-hole of the cover. The sidewalls may be configured to prevent light from the battery indicator light from reaching the sensor. This reduces the noise of the camera.

The substrate may be formed of aluminum. This reduces the weight of the device, allowing it to be more easily and accurately moved by a wafer handling robot.

According to a further aspect of the disclosure, there is provided a method of manufacturing an alignment device for use in a wafer processing system, the method comprising: forming a substrate configured to be handled by the wafer processing system; forming a sensor on a first surface of the substrate, wherein the sensor is configured to capture information relating to a position of the wafer relative to the wafer processing system; and forming a transmitter configured to wirelessly transmit the captured information to a receiver.

According to a further aspect of the disclosure, there is provided a method of aligning a wafer handling robot in a wafer processing module, the method comprising:

(i) inserting an alignment device according to any preceding claim into the wafer handling robot;

(ii) using the sensor to capture information relating to a first position of the alignment device relative to the wafer processing module;

(iii) wirelessly transmitting the captured information, relating to the first position, from the transmitter to a receiver;

(iv) moving a position of the wafer handling robot based on the captured information relating to the first position;

(v) using the sensor to capture information relating to an updated position of the alignment device relative to the wafer processing module; and (vi) wirelessly transmitting the captured information, relating to the updated position, from the transmitter to a receiver, wherein the alignment device is retained in the wafer handling robot during and between steps (ii) to (vi). The method allows alignment of the wafer handling robot to be adjusted without manual user intervention.

The method of aligning a wafer handling robot in a wafer processing module may further comprise: (vii) comparing the updated position with a target position; and (viii) if the updated position is within a threshold distance from the target position, the method further comprises storing a calibration value relating to the updated position. This allows alignment of the wafer handling robot to be incrementally improved.

The method of aligning a wafer handling robot in a wafer processing module may further comprise moving the alignment device from the updated position within the semiconductor processing module to a position within a further wafer processing module. The alignment device may be retained in a wafer handling robot whilst moving between the semiconductor processing tool and the further wafer processing module.

Features of different aspects of the present disclosure may be combined together.

The herein disclosed alignment device has the following advantages:

The wireless transmission of a camera image to a portable device allows an operator to complete full wafer handling robot setup without removing the wafer from the robot;

The wireless alignment device is suitable for aligning each robot within a series of modules of a wafer processing system and thus fully completing a robot handling setup on a photo lithography system without having to manually move the position of the alignment wafer at every location;

The wireless alignment device allows alignment of the robot handling tools to be fully automated. This may be done using teach software commands;

The use of the herein disclosed alignment device reduces the time required to complete the wafer handling robot setup task. The estimated time saved is 60% per setup leading to increased productivity for the site with reduced risk of quality or safety incidents.

According to a further aspect of the disclosure, there is provided a frame for calibrating an alignment device as described above, the frame comprising: a base configured to support the substrate of the alignment device; a plurality of sidewalls configured to engage with an edge of the substrate; and a target configured to be imaged by the sensor of the alignment device.

The target may be located at a center point of the frame.

The frame may comprise a plurality of arms extending from the base to the sidewalls.

The frame may comprise a plurality of target support members configured to hold the target at a predetermined distance from the base.

According to a further aspect of the disclosure, there is provided a method of calibrating an alignment device as described above, using the frame as described above, wherein the method comprises:

i) placing the alignment device in the frame;

ii) capturing information relating the position of the target relative to the sensor of the alignment device;

iii) determining if the sensor of the alignment device is in a correct position relative to the target; and iv) if the sensor of the alignment device is not in a correct position relative to the target, adjusting the position of sensor relative to the substrate of the alignment device, and repeating steps ii) and iii); and v) if the sensor of the alignment device is in a correct position relative to the target, securing the sensor to the substrate.

According to another aspect of the present disclosure, an alignment device for use in a wafer processing system is provided, which includes: a substrate having a through-hole; a sensor mounted on a first surface of the substrate, the sensor configured to capture, via the through-hole, information relating to a position of the alignment device in the wafer processing system; and a transmitter mounted on the first surface of the substrate and coupled to the sensor, the transmitter configured to wirelessly transmit the information captured by the sensor.

According to yet another aspect of the present disclosure, a method of aligning a wafer handling robot in a wafer processing system is provided that includes: placing an alignment device in the wafer handling robot, the alignment device being at a first position in the wafer processing system, and the alignment device comprising a substrate having a through-hole and a sensor mounted on a first surface of the substrate; capturing, utilizing the sensor via the through-hole, information relating to the first position of the alignment device; wirelessly transmitting, to a receiver by use of a transmitter of the alignment device, the information relating to the first position of the alignment device; determining, based on the information relating to the first position, whether the alignment device at the first position is within a threshold distance from a target position in the wafer processing system; and when the alignment device at the first position is beyond the threshold distance from the target position, determining, based on the first position and the target position, a first updated position for the alignment device in the wafer processing system, and moving the wafer handling robot to move the alignment device from the first position to the first updated position.

According to yet another aspect of the present disclosure, a frame is provided for calibrating an alignment device. The alignment device includes a substrate in a circular shape and a sensor mounted on a first surface of the substrate, and the substrate has a through-hole in a center of the substrate. The frame includes: a base in a ring-shape; a plurality of radial arms extending from the base, each of the plurality of radial arms having a sidewall at a distant edge of a corresponding radial arm, and the plurality of radial arms extending to a length such that the sidewall is engageable with an edge of the substrate when the substrate is placed onto the frame with a second surface of the substrate facing a first surface of the frame, wherein the first surface and the second surface of the substrate being opposing surfaces; and a target suspended above a second surface of the frame and aligned with a center point of the frame, the first surface and the second surface of the frame being opposing surfaces, and the target being aligned with the through hole of the substrate such that a position of the camera on the substrate is adjusted based on images of the target taken by the sensor through the through-hole.

According to yet another aspect of the present disclosure, a method of calibrating the alignment device using the frame of the above aspect includes: i) placing the alignment device on the frame with the second surface of the substrate facing the first surface of the frame; ii) capturing, using the sensor of the alignment device at a current position on the substrate of the alignment device, information relating to a position of the target; iii) determining, based on the information captured relating to the position of the target, whether the sensor of the alignment device at the current position satisfies a location requirement; iv) when the sensor of the alignment device at the current position does not satisfy the location requirement, adjusting the current position of the sensor on the substrate of the alignment device, and repeating steps ii) and iii); and v) when the sensor of the alignment device at the current position satisfies the location requirement, securing the sensor to the substrate of the alignment device at the current position.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

REFERENCE NUMERALS

| | |
|---|---|
| 100 | Alignment wafer |
| 105 | Substrate wafer |
| 110 | Outer cover |
| 115 | Battery indicator |
| 120 | Light |

-continued

| | |
|---|---|
| 125 | Through-hole |
| 130 | Reticle |
| 135 | Mirror |
| 140 | Camera mount |
| 145 | Cover mount pins |
| 150 | Battery |
| 155 | Antenna |
| 160 | Camera |
| 165 | Battery cut off switch |
| 170 | Camera mount pins |
| 175 | Battery control module |
| 180 | Power switch |
| 185 | Camera control module |
| 190 | Transistor |
| 195 | Charging port |
| 210 | Cover slide |
| 215 | Battery indicator through-hole |
| 220 | Sidewall |
| 300 | Calibration frame |
| 310 | Frame arms |
| 315 | Arm sidewall |
| 320 | Target |
| 325 | Target suspension members |
| 330 | Frame base |
| 340, 350 | Opposing surfaces of frame 300 |

DETAILED DESCRIPTION OF ILLUSTRATIVE EMBODIMENTS

The making and using of embodiments of this disclosure are discussed in detail below. It should be appreciated, however, that the concepts disclosed herein can be embodied in a wide variety of specific contexts, and that the specific embodiments discussed herein are merely illustrative and do not serve to limit the scope of the claims. Further, it should be understood that various changes, substitutions and alterations can be made herein without departing from the spirit and scope of this disclosure as defined by the appended claims.

Further, one or more features from one or more of the following described embodiments may be combined to create alternative embodiments not explicitly described, and features suitable for such combinations are understood within the scope of this disclosure. It is therefore intended that the appended claims encompass any such modifications or embodiments.

Figure 1:
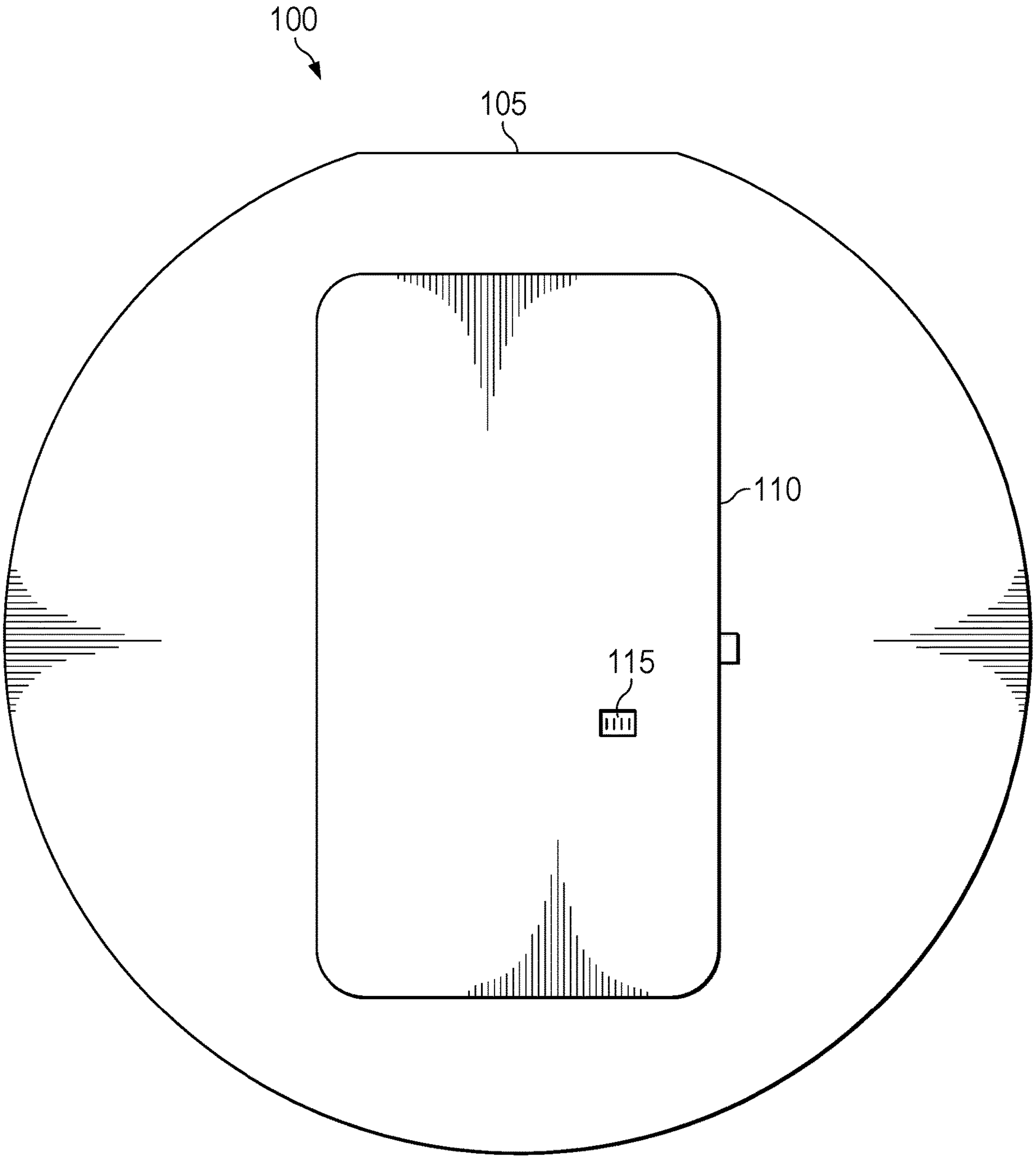
FIG. 1 illustrates a top view of an example wafer according to an embodiment of the disclosure.
Figure 3:
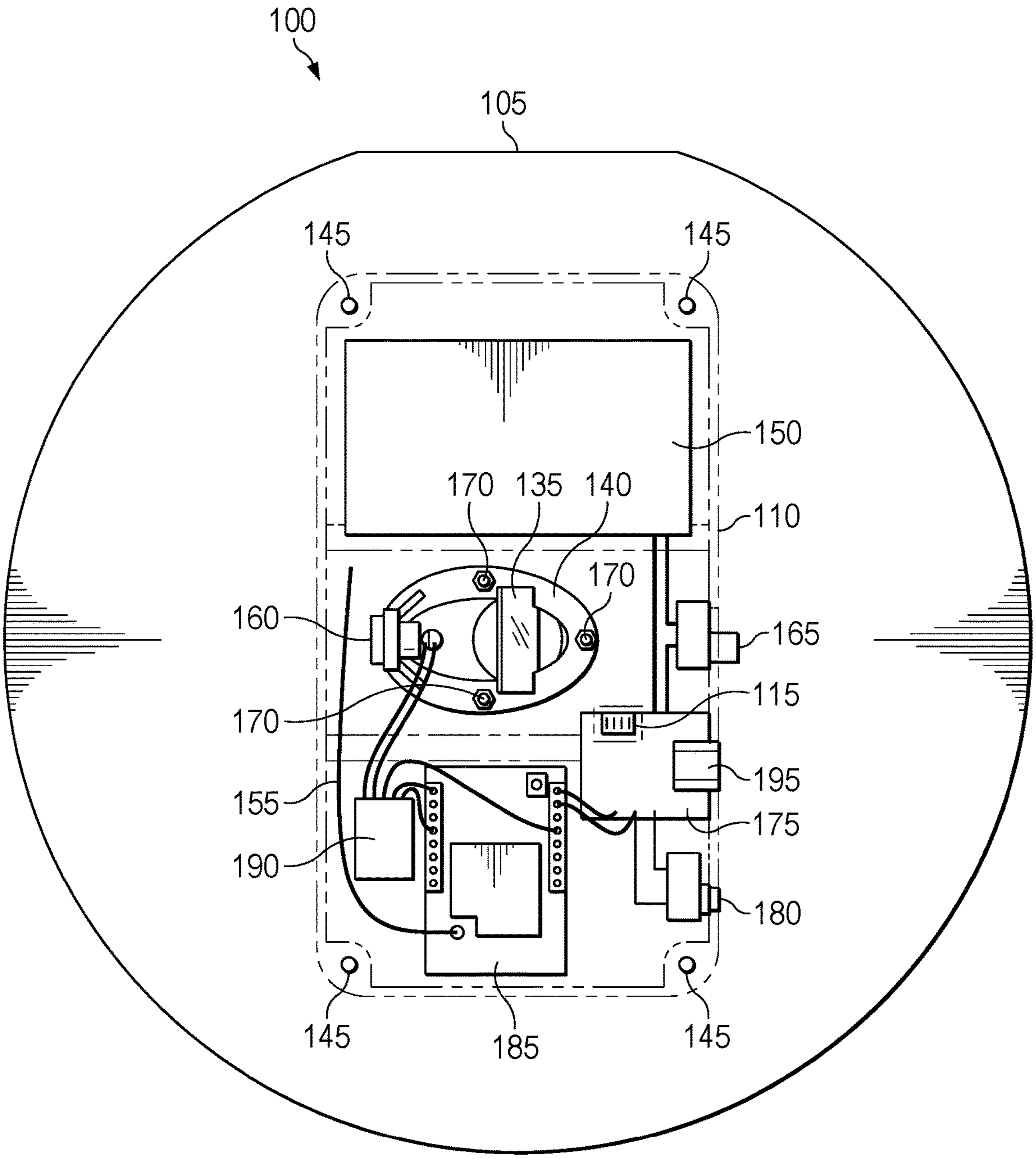
FIG. 3 illustrates schematically a top view of another example wafer according to an embodiment of the disclosure, highlighting components located within an outer cover of the wafer.

FIG. 1 is a top view of an example alignment wafer 100 according to an embodiment of the disclosure. The alignment wafer 100 includes a substrate 105. The substrate 105 may also be referred to as a substrate wafter 105, which terms may be used interchangeably. The substrate 105 may be a semiconductor substrate or may be a substrate formed of an alternative material. The substrate 105 may be an aluminum frame having holes or slots for mounting other components of the alignment wafer 100 to the substrate 105. The use of an aluminum frame reduces the weight of the device, i.e., the alignment wafer 100. In the following, the terms of "device," "alignment wafer," "alignment device" and "calibration wafer" are used interchangeably. The substrate 105 may be sized to be handled by a wafer processing system for which the alignment wafer 100 is to be utilized with. The substrate 105 may be in a generally circular shape as shown, and it may also be in other shapes if applicable. A number of components (including electronic components) of the alignment wafer 100 may be located on an upper surface of the substrate 105 and located within an outer cover 110, as shown in FIG. 3 provided subsequently. The outer cover 110 has a through-hole 215 (see FIG. 4, also referred to as a battery indicator through-hole) through which a battery indicator 115 can be viewed. The battery indicator 115 may be a light and can be used to display the status of a battery 150 (as shown in FIG. 3) within the outer cover 110. A battery cut off switch 165 (see FIG. 3) extends out of a side surface of the outer cover 110, and can be used to disconnect the battery 150 from the other components of the device to disconnect the power to the device.

The outer cover 110 and the substrate 105 may cooperate to form a complete enclosure around the electronic components and other components within the outer cover 110, thereby protecting the components within the outer cover 110 from any potentially damaging substances found in the semiconductor processing modules of a wafer processing system. The components within the outer cover 110 may be attached to the substrate wafer 105 using an adhesive, such as a single-sided adhesive or a double-sided adhesive. Alternatively, the substrate wafer 105 may be fabricated to include slots or connectors for mounting the components of the alignment wafer 100. This can be used to reduce the thickness of the alignment wafer 100.

Figure 2:
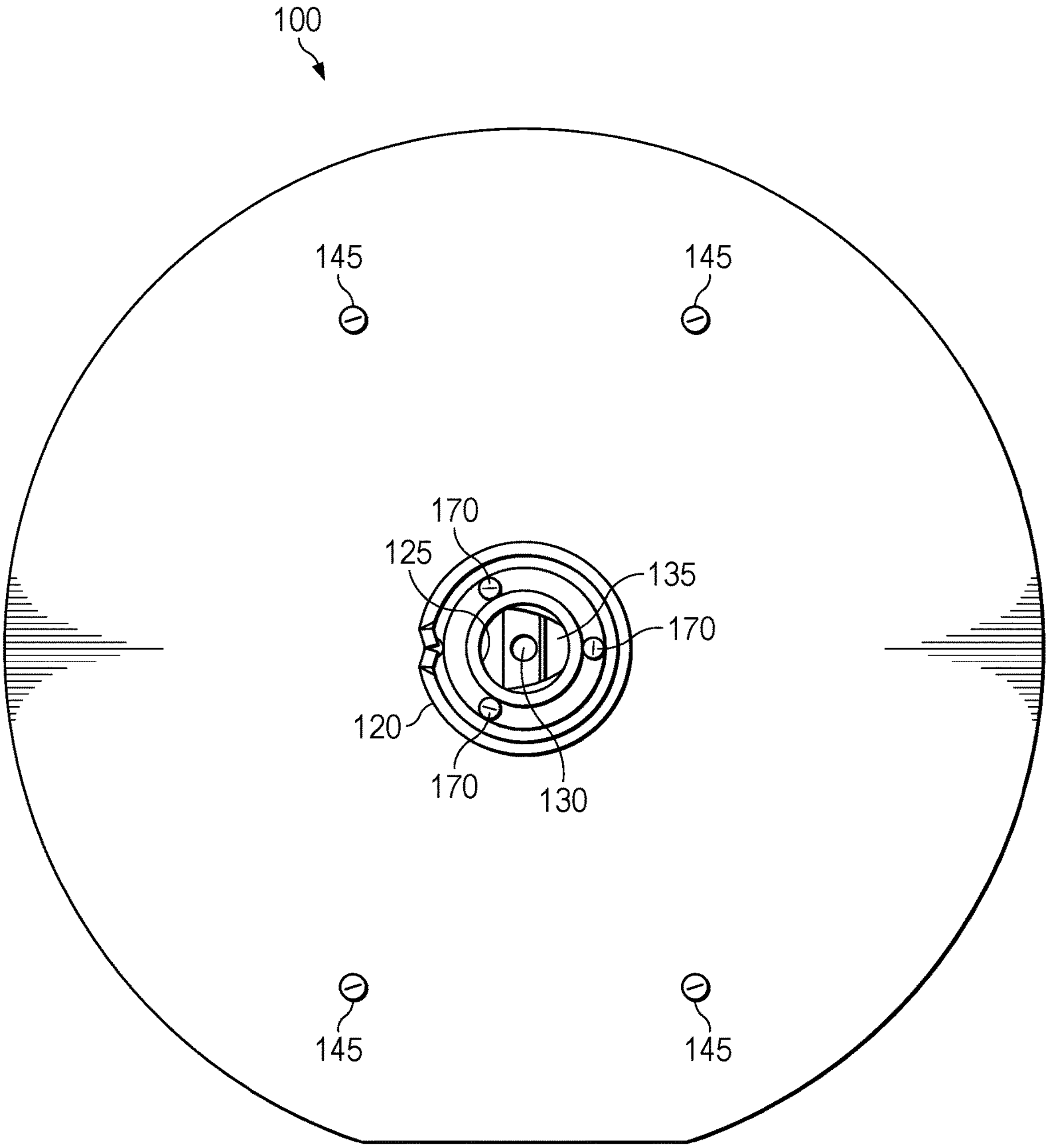
FIG. 2 illustrates schematically a bottom view of an example wafer according to an embodiment of the disclosure.

Referring to FIGS. 2 and 3, FIG. 2 illustrates schematically a bottom view of the alignment wafer 100 of FIG. 1, and FIG. 3 illustrates schematically a top view of the alignment wafer 100, highlighting components located within the outer cover 110 of the alignment wafer 100. The outer cover 110 may be attached to the substrate 105 using a plurality of cover mount pins 145. The substrate 105 has a through-hole 125 or aperture. A camera 160 located within the outer cover 110 is able to be viewed out of the through-hole 125 by use of a mirror 135 located above the through-hole 125 and within the outer cover 110. The camera 160 is mounted on a camera mount 140 that is attached to the substrate 105 using a plurality of camera mount pins 170 or screws. The camera 160 may be attached to the camera mount 140 using an adhesive. A reticle 130 (for example, a crosshair or circle) is located within the through-hole 125 and acts as a reference that can be used to visually indicate alignment of the alignment wafer 100 within a semiconductor processing module of the wafer processing system. The reticle 130 may be formed on a separate cover. For example, the reticle 130 may be a glass reticle 130 having a round crosshair in the middle formed of embedded fibers or etched on the glass. In some examples, the reticle 130 may be held in place using the same material as the outer cover 110, e.g. PLA (polylactic acid). For ease of calibrating the wafer handling robots of the wafer processing system using the alignment wafer 100, the through-hole 125 and the reticle 130 may be located at a center point of the substrate wafer 105 such that the camera 160 provides an image of the view of a semiconductor processing module of the wafer processing system from the center point of the alignment wafer 100. The alignment wafer 100 may include a protective film (not shown) formed across the through-hole 125. The reticle 130 may be located on the protective film.

A light 120 is located on a bottom surface of the substrate 105. The light 120 may also be referred to as a backlight. The light 120 may be a strip light-emitting diode (LED) that extends around the through-hole 125 as shown in this example, or may be other applicable types of light and in other applicable shapes. The light 120 illuminates the interior of the semiconductor processing module such that the camera 160 can capture an image of the semiconductor processing module through the through-hole 125. The strip LED may be attached to the substrate wafer 105 using an adhesive such as epoxy glue.

Figure 4:
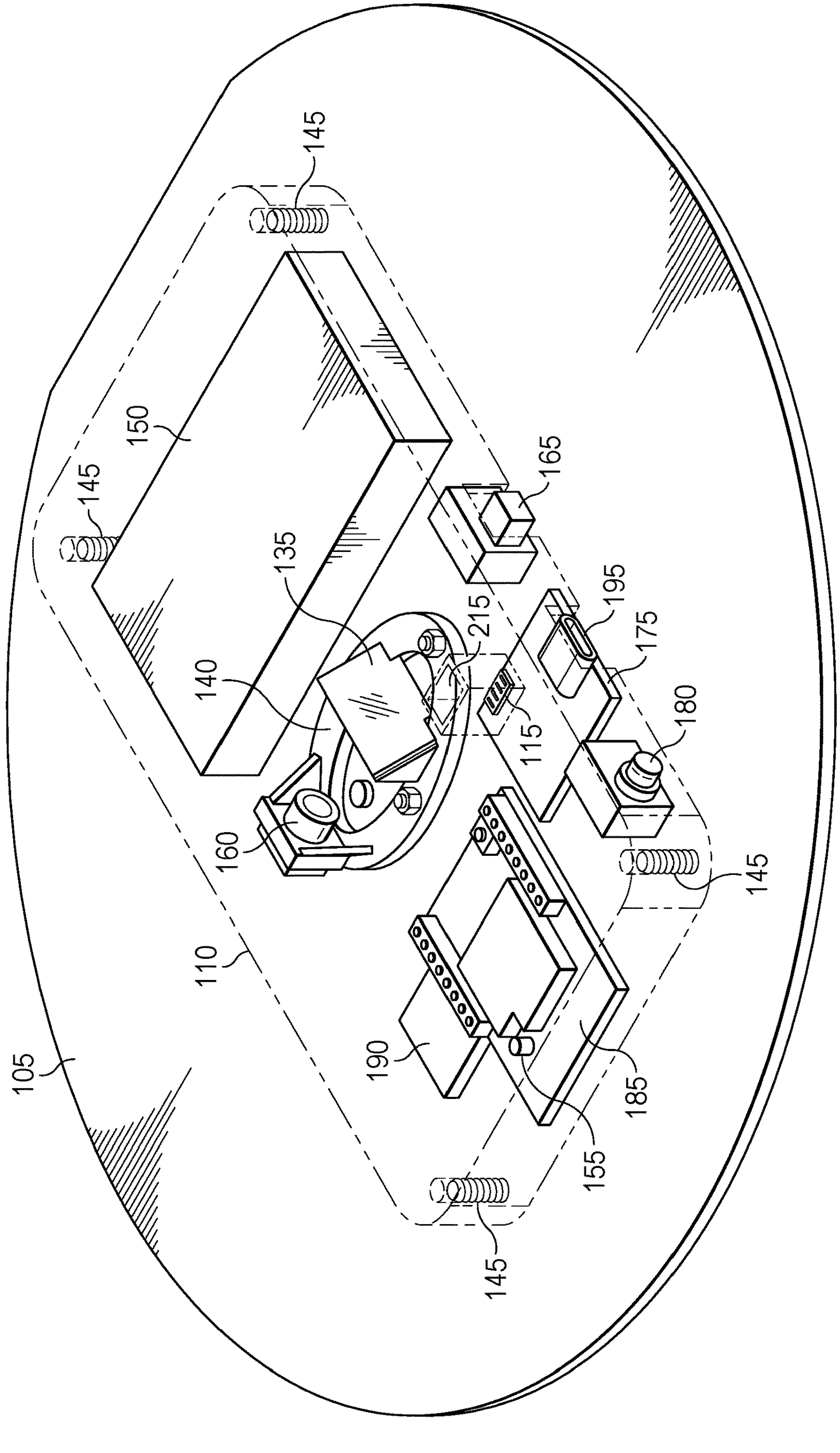
FIG. 4 illustrates a perspective view of an example wafer according to an embodiment of the disclosure.

FIG. 4 is a top perspective view of the alignment wafer 100 of FIGS. 1-3, highlighting the components within the outer cover 110 of the alignment wafer 100. Referring to FIGS. 3 and 4, the outer cover 110 is shown as transparent to allow the components located within the outer cover 110 to be visible for illustration purposes. It should be understood that in general, the outer cover 110 is opaque to reduce stray light reaching the camera 160.

As shown, the battery 150 is located on the substrate 105 and is used to power the components of the alignment wafer 100. The battery 150 is connected to the battery cut off switch 165 and a battery control module 175. The battery cut off switch 165 is also connected to the battery control module 175, and can be pressed by a user to cause a break in the circuit between the battery 150 and the battery control module 175 to cause the power to the battery control module 175 to be removed. This prevents battery discharge when the alignment wafer 100 is not in use.

The battery control module 175 controls the charge and discharge of the battery 150. The battery control module 175 has the battery indicator 115 that provides information about the battery 150. The battery indicator 115 may be a light source that provides a visual indication of the level of charge of the battery 150. The indication may be provided by the color of the light source or the intensity of the light source. In the example shown, the battery indicator 115 includes 4 light emitting diodes (LEDs), where the number of diodes illuminated is related to the battery charge level.

The battery 150 may be selected to provide a compromise between minimizing the weight and thickness of the battery 150 and allowing the alignment wafer 100 to be operated for a suitable amount of time on a single charge. Table 1 below lists example batteries that may be used as the battery 150. The batteries listed are all LiPo batteries, and other types of batteries may also be used. Example alignment wafers may be fabricated using the following batteries:

TABLE 1

| Capacity and Type | Weight | Operational time |
|---|---|---|
| 500 mAh LiPo | 16 g | ~90 minutes of nonstop stream with 130 mA LED on ~2 hours and 30 minutes with backlight off |
| 3000 mAh LiPo | 48.5 g | ~9.5 hours of nonstop stream with 130 mA LED on ~16.5 hours (no backlight) |
| 10000 mAh LiPo | 155 g | ~32 hours ~55 hours (no backlight) |

In the example in Table 1, the 10000 mAh LiPo battery provides the longest working time, though the 3000 mAh LiPo battery may be preferable due to the decreased weight.

A charging port 195 is connected to the battery control module 175 and has an opening on the side surface of the outer cover 110. This allows the battery 150 of the alignment wafer 100 to be charged by connecting the charging port 195 to a wired connection. In an example, the charging port 195 may be configured to be a standard charging port that connects to a USB type-C connector system.

Those ordinarily skilled in the art would understand that an alternative charging port connection or a wireless charging system may also be utilized. In an example, wireless charging of the alignment wafer 100 may be implemented by placing the alignment wafer 100 inside a charging case having a battery with a higher capacity than the battery 150 of the alignment wafer 100. For example, the alignment wafer 100 may be recharged by inductive charging through a wireless charging module including a conductive coil located within the alignment wafer 100 and connected to the battery 150. This would increase the weight of the alignment wafer 100 in comparison to an alignment wafer with a charging port.

The battery control module 175 may be configured to operate at a suitable power level to charge and discharge the battery 150 and provide power to other components of the alignment wafer 100. As an example, the battery control module 175 may be configured to step-up the voltage provided by the charging port 195 or the battery 150 to 5V. The battery control module 175 may be configured to charge the battery 150 at a maximum charge current of 2.1 A and discharge the battery 150 at a maximum discharge current of 3.5 A. The battery control module 175 is configured to include a plurality of built-in protections such as over voltage, over current, input short circuit and overheating protections.

The time taken to charge a battery as discussed above from 0 charge to 100% charge, using a 5V and 2.1A power source provided from the battery control module 175 to the battery is set out as below in Table 2, as examples:

TABLE 2

| Capacity and Type | Charge time |
|---|---|
| 500 mAh LiPo | ~20 minutes |
| 3000 mAh LiPo | ~1 hour 45 minutes |
| 10000 mAh LiPo | ~5 hour 45 minutes |

The battery control module 175 is also connected to a power switch 180. The power switch 180 may extend out of the side surface of the outer cover 110, and by virtue of being connected to the battery control module 175, it can be operated by a user to turn on and turn off the alignment wafer 100. The power switch 180 may be selected to be a single switch that can be pushed a first set number of times to switch the alignment wafer 100 on, and a second set number of time to switch the alignment wafer 100 off.

The camera 160 is located on the camera mount 140. In this example, the camera mount 140 is an oval shaped mount having a first end positioned over the through-hole 125 and a second end laterally spaced from the first end. The mirror 135 is attached to the first end of the camera mount 140, and the camera 160 is attached to the second end of the camera mount 140. The camera mount 140 may include a slot, and the mirror 135 may be located within the slot of the camera mount 140.

Figure 5:
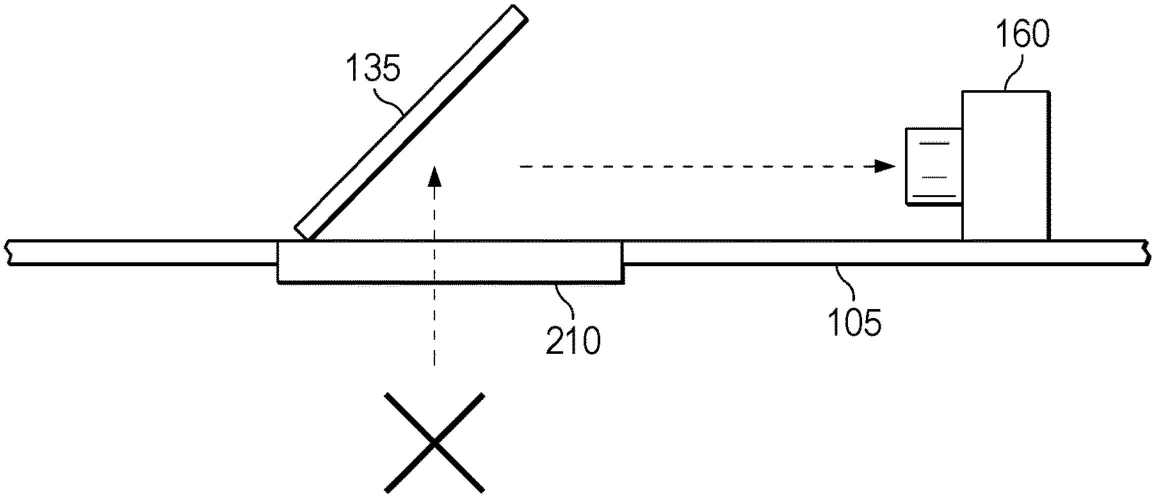
FIG. 5 illustrates schematically a side view of an optical system provided on a wafer according to an embodiment of the disclosure.

FIG. 5 illustrates schematically a side view of an optical system of the alignment wafer 100. The optical system may include the mirror 135, the through-hole 125, and the camera 160. The mirror 135 may be oriented at an angle of about 45° with respect to the top surface of the substrate 105, such that light or infrared radiation (IR) transmitted perpendicular to the top surface of the substrate 105 from below the alignment wafer 100 and incident on the through-hole 125 is reflected by the mirror 135, and travels along a plane parallel to the top surface of the substrate 105 and is received at the camera 160. The camera 160 is oriented to receive light travelling parallel to the top surface of the substrate 105 from the mirror 135. A cover 210 may be provided for covering the reticle 130 located within the through-hole 125.

By providing the mirror 135, the focal length of the camera 160 extends in parallel to the top surface of the substrate 105, rather than normal to the top surface of the substrate 105. This allows the thickness of the alignment wafer 100 to be reduced, which facilitates the alignment wafer 100 to be utilized in wafer processing machines, whilst also allows the camera 160 with an increased focal length to be used.

The battery 150 may also be selected such that the thickness of the alignment wafer 100 is not substantially increased. The thickness of the battery 150 may be less than or equal to 10 mm. For example, a 3000 mA LiPo battery has a thickness of 10 mm, and thus the minimum height of the outer cover 110 above the substrate 105 may be approximately 11 mm. The reticle 130 and the cover 210 for the reticle may be selected to have a total thickness of approximately 2 mm. The alignment wafer 100 may use the substrate 105 having a thickness of approximately 1 mm. The overall thickness of the alignment wafer 100 may therefore be approximately 15 mm.

The camera 160 may be configured to have a resolution such that the alignment wafer 100 may be used to align the wafer processing machines to a sufficient precision level required for the relevant wafer processing machine. As an example, a 2-megapixel (MP) camera may be used.

The battery control module 175 may be connected to a camera control module 185 and power the camera control module 185. The camera control module 185 is connected to the camera 160 such that images or videos captured by the camera 160 are received by the camera control module 185. The camera control module 185 is connected to an antenna 155 to wirelessly transmit the images or videos captured by the camera 160 to a further device such as a user's computer or mobile device, e.g., for processing or for further use. The antenna 155 may be configured to wirelessly connect to a local area network or a wide area network, for example, using Wi-Fi. In some examples, after powering on, the camera control module 185 and the antenna 155 may create a Wi-Fi network which can be connected to by one or more external devices. In an example, the created Wi-Fi network may allow a single device, such as a laptop, tablet or smartphone, to connect at a given time. The camera control module 185 may also host a website, which can be used to interact between the camera 160 and the camera control module 185, and may be used to view a live video stream from the camera 160.

In the example shown, the antenna 155 is provided inside the outer cover 110 of the alignment wafer 100. To increase the range of the wireless connection, the antenna 155 may be located outside of the outer cover 105, or a second, external antenna may be used in addition to the built-in antenna 155. In some examples, the camera control module 185 may be equipped with a Wi-Fi antenna. Alternatively, a separate antenna may be used that is connected to the camera control module 185 and is located within the outer cover 105. The antenna 155 may also be referred to as a transmitter, and may include circuits and/or components configured for transmitting signals wirelessly.

The camera control module 185 may be a motherboard. The size and power of the motherboard may be selected such that the motherboard is powerful enough to handle live video streams from the camera 160 while minimizing the size of components located on the substrate 105. For example, the camera control module 185 may be selected to have a maximum power consumption of 310 mA at 5V with the light 120 powered on, and a maximum power consumption of 180 mA when the light 120 is not powered. In an example, the camera control module 185 may include an integrated camera port and built-in Wi-Fi, mobile network modules, and Near Field Communication Technology such a BLUETOOTH. The camera control module 185 may be selected to be suitable for operation in a range of temperatures such that the wafer processing machines do not have to be cooled down or heated up for the alignment wafer 100 to be used, for example, the camera control module 185 may have an operating temperature range of −20° C. to 85° C.

The camera control module 185 may be connected to a transistor 190. The transistor 190 may also be connected to the light 120 and powers the light 120 from the output of the camera control module 185 such that the light 120 is operating when an image is to be captured.

Figure 6:
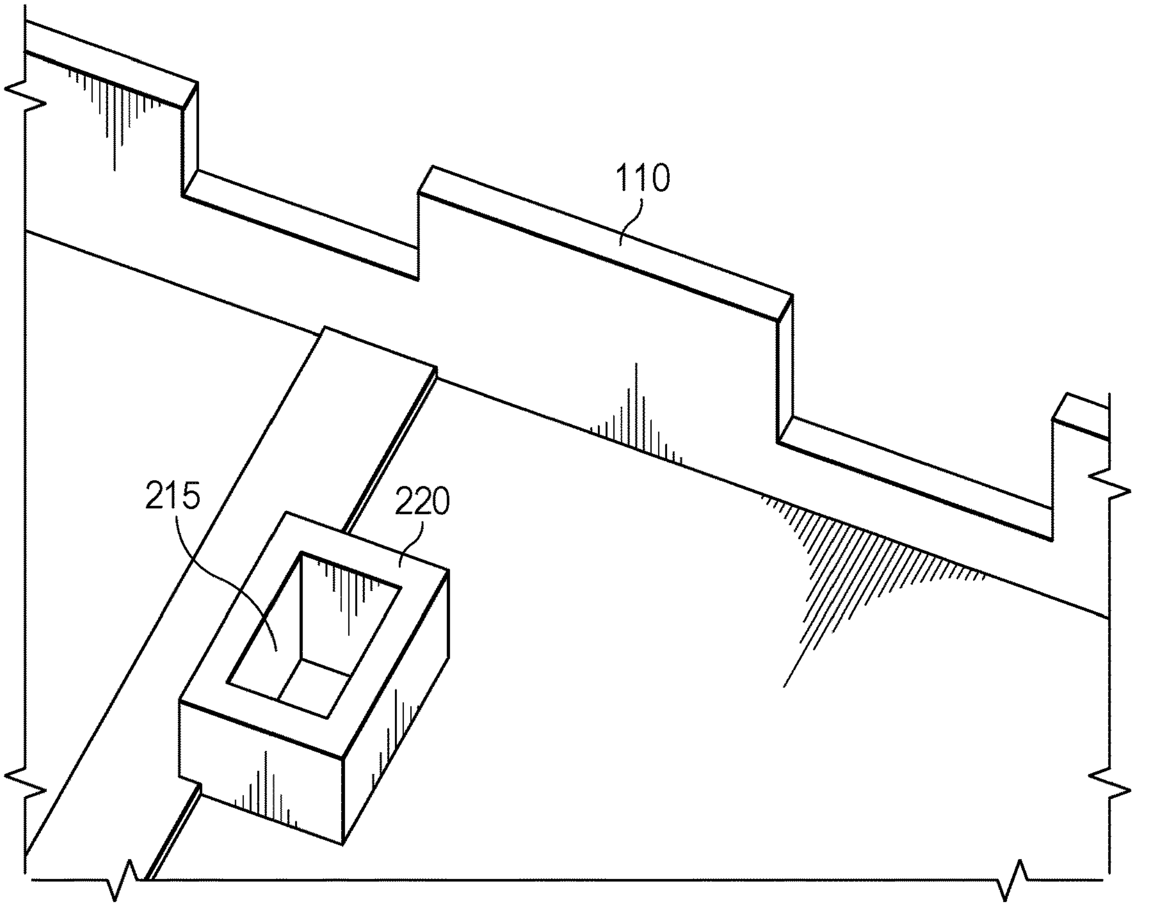
FIG. 6 illustrates an internal view of a portion of an outer cover of an example wafer according to an embodiment of the disclosure.

FIG. 6 illustrates an internal view of a portion of the outer cover 110 of the alignment wafer 100. The portion includes the battery indicator through-hole 215 surrounded by a sidewall 220 at the interior surface of the outer cover 110 opposite to the top surface of the alignment wafer. The sidewall 220 helps reduce stray light from above (or outside of) the outer cover 110 from reaching the camera 160 within the outer cover 110 and improves the visibility of the battery indicator 115.

Figure 7:
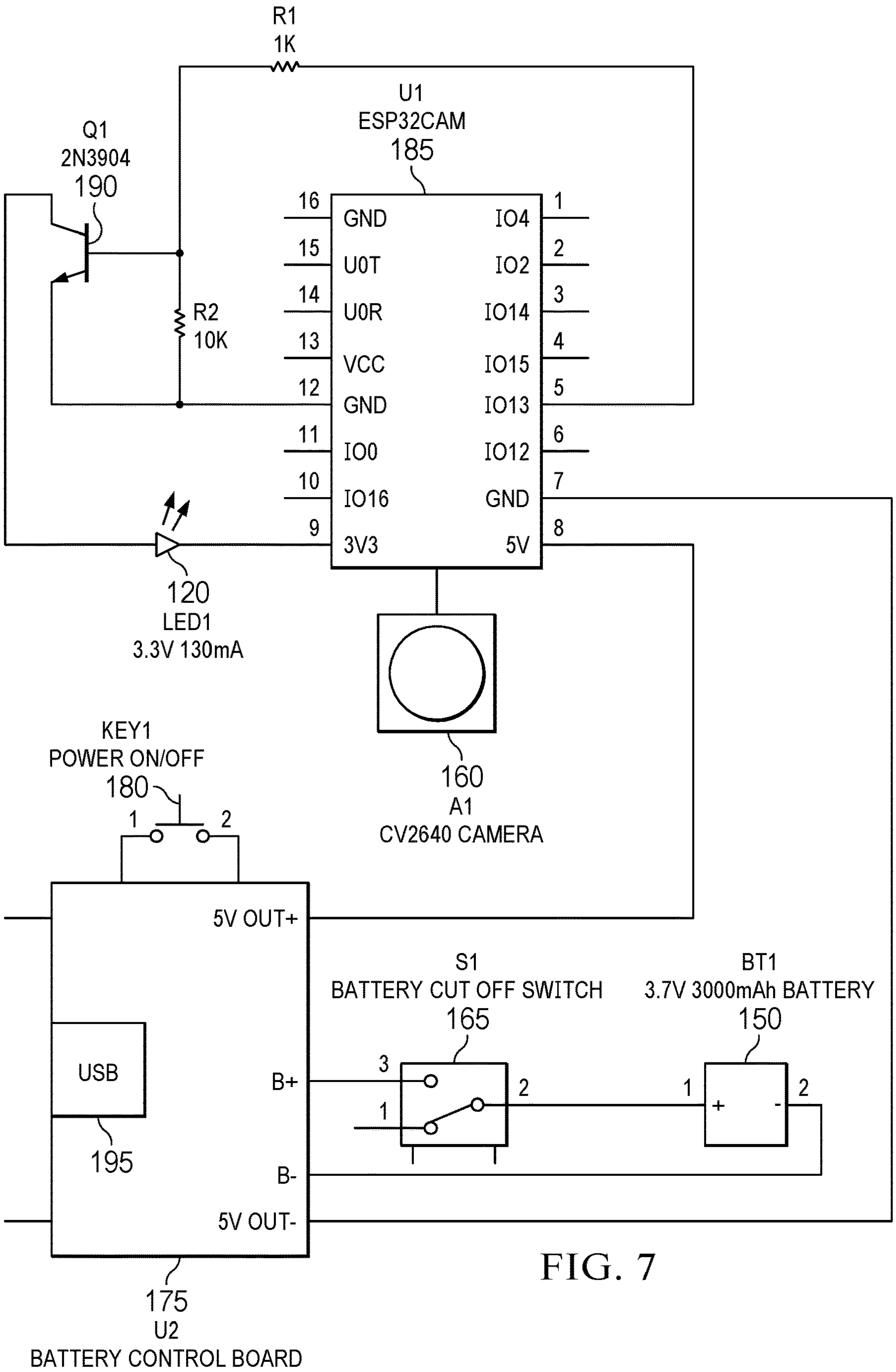
FIG. 7 shows a circuit diagram of components that may be formed on a wafer according to an embodiment of the disclosure.

FIG. 7 shows a circuit diagram of the components formed on a wafer according to an embodiment of the disclosure. FIG. 7 illustrates a circuit that may be included in the alignment wafer 100 as described above. The circuit includes examples of the corresponding components as shown and described with respect to FIGS. 3 and 4. In an example, the camera 160 may be a CV2640 camera. The battery 150 may be a 3.7v, 3000 mAh battery. The battery control module 175 may be a battery control board. The camera control module 185 may be a ESP32-CAM board. The transistor 190 may be a 2N3904 transistor. Those of ordinary skill in the art would recognize that these components of the circuit may also be implemented by use various other components that are applicable.

Figure 8:
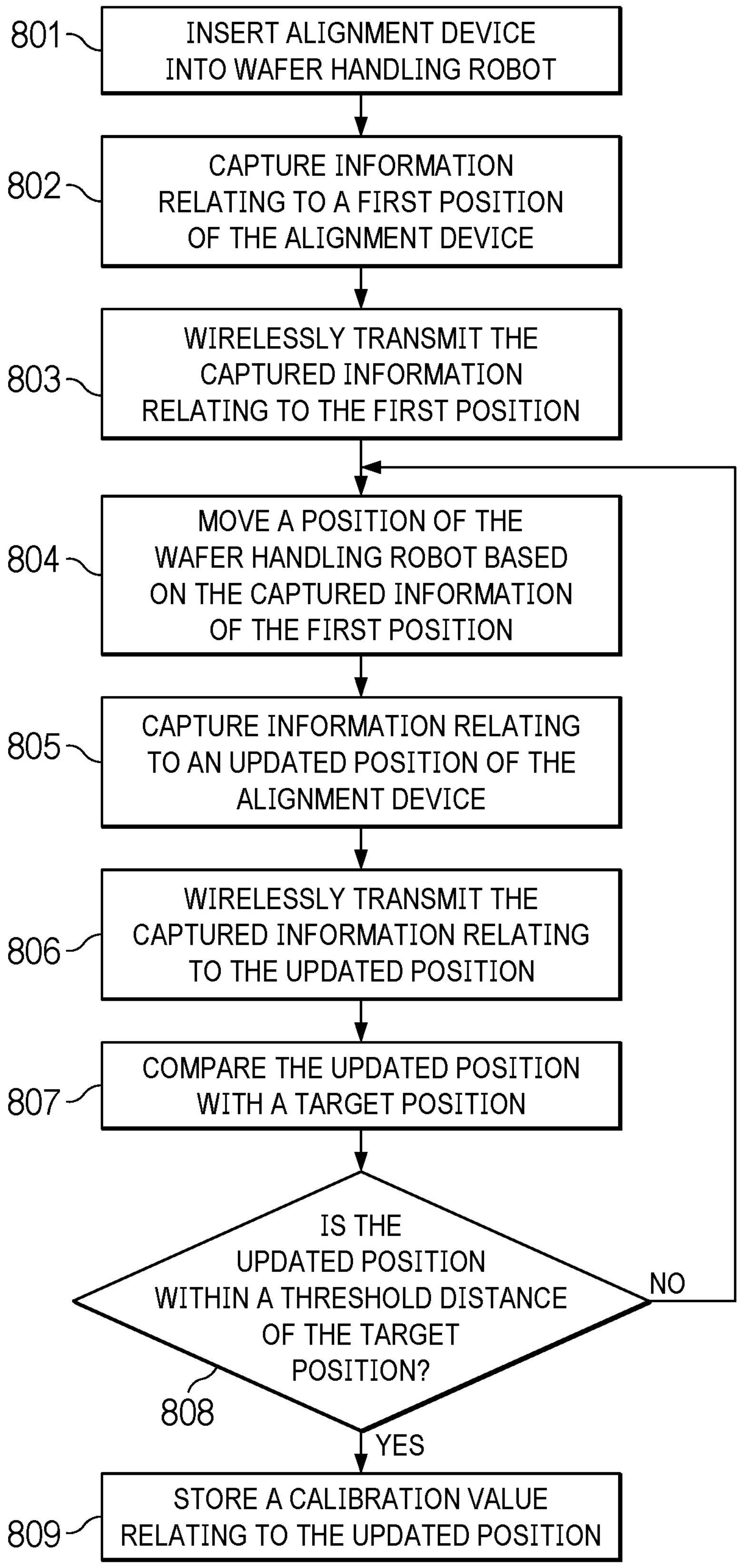
FIG. 8 illustrates an example method of aligning a wafer handling robot in a semiconductor processing module according to an embodiment of the disclosure.

FIG. 8 is a flowchart of an example method of aligning a wafer handling robot in a wafer processing system according to an embodiment of the disclosure. The method includes the following steps which are performed in the order as described below. Steps 802 to 808 may be performed while an alignment wafer is held or retained by the wafer handling robot, without manual user intervention to position the alignment wafer. As used herein, the terms of "wafer handling robot" and "robot" are used interchangeably, and the terms "alignment wafer," "alignment device," and "calibration wafer" are used interchangeably. The wafer processing system may include various wafer processing modules, such as transfer unit(s), hot plate(s), cooling plate(s), and so on. Each wafer processing module may be associate with a processing tool. The wafer handling robot may be programmed to position a wafer in a desired location inside each processing module for the wafer to be processed by an associated processing tool.

In step 801, an alignment wafer, e.g., the alignment wafer 100 as shown in FIGS. 1 to 4 and described above, is inserted into the wafer handling robot (e.g., a robot arm). The alignment wafer may be inserted into the robot by a user, or may be collected by the robot from a loading location and subsequently held by the robot. The wafer handling robot may then move itself, and the alignment wafer, into a semiconductor processing module of the wafer processing system, and move the alignment wafer to a first position in the semiconductor processing module. The first position may be referred to as the current position of the wafer handling robot or the alignment wafer.

In step 802, a sensor is used to capture information relating to the first position of the alignment wafer relative to a semiconductor processing tool of the semiconductor processing module. In an example, this involves the camera capturing an image of the interior of the semiconductor processing module through the reticle.

In step 803, the captured information, relating to the first position, is wirelessly transmitted from the antenna of the alignment wafer to a receiver. The receiver may be a separate computing device or a display located externally to the semiconductor processing module, for example, the receiver may be a user's mobile phone, smart phone, tablet, personal digital assistant (PDA), a laptop, or any other type of computer.

In step 804, the wafer handling robot is moved within the semiconductor processing module, based on the captured information of the first position. The wafer handling robot may be controlled by a user, or may be autonomously controlled by a controller, e.g., a software or firmware. The wafer handling robot moves the alignment wafer from the first position to an updated position, where the updated position may be closer to a target position than the first position.

In some embodiments, the receiver, when receiving the captured information of the first position wirelessly, may determine the updated position based on the captured information of the first position and the target position. The receiver may compare the first position and the target position, and determine the updated position for the alignment wafer to move to. Various algorithms may be used to calculate the updated position. The receiver may then instruct the wafer handling robot to move the alignment wafer from the first position to the updated position, e.g., through a software, or a firmware. In response to the instruction from the receiver, the wafer handling robot, and consequently, the alignment wafer, is moved accordingly. The receiver may include a first device for receiving the position information wireless from the alignment wafer and a second device for controlling the wafer handling robot. The first device and the second device may be a same device (e.g., a computer) or separate devices (e.g., separate computers). The second device may communicate with the wafer handling robot wirelessly or in wired.

In some embodiments, the receiver may be a computer, e.g., a tablet, that is configured to wirelessly receive the captured information (e.g., captured video footage) of the first position (i.e., the current position of the wafer handling robot) from the transmitter of the alignment wafer 100, e.g., in real time. The captured video footage indicates the first position of the wafer handling robot (e.g., a robot arm holding the alignment wafer) in the wafer processing module. A user (e.g., an operator, an engineer) may visually check the first position of the wafer handling robot in relation to the target position using the crosshair, and based thereon, determine the updated position. The user may adjust the position of the wafer handling robot by use of a software/firmware installed on the same computer, or a different computer which is connected to the wafer handling robot, wirelessly or in wire. For example, the captured video footage may be displayed on a screen of the tablet, and when the user observes on the screen that the first position is beyond a threshold distance from the target position, the user may enter an instruction through an interface of a software to instruct the wafer handling robot to move to the updated position. The interface of the software may be displayed on a screen of a different computer, e.g., a laptop. The software is configured to control the wafer handling robot.

The target position may be a predetermined position within the semiconductor processing module of the wafer processing system. The target position may be determined based on a specific semiconductor processing tool, in the semiconductor processing module, that is to process a wafer. The target position may vary depending on the specific semiconductor processing tool to use. The first position may be a pre-set initial position for the robot to move. The first position may be determined based on the robot that is to operate and/or the semiconductor processing tool that is to process a wafer in the wafer processing system.

In step 805, the sensor is used to capture information relating to the updated position of the alignment wafer relative to the semiconductor processing tool of the semiconductor processing module. In an example, this involves the camera capturing a further image of the interior of the semiconductor processing module through the reticle. The information captured may be separate sets of information captured at discrete points in time, or may include a series of information points recorded at regular time intervals, or may include continuously captured information (e.g. recording a video using the camera).

In step 806, the captured information, relating to the updated position, is wirelessly transmitted from the antenna of the alignment wafer to the receiver. The receiver may be a separate computing device or a display located externally to the semiconductor processing module, for example, the receiver may be a user's mobile phone or computer.

In step 807, the updated position is compared with the target position, where the target position is a predetermined position within the semiconductor processing module. A distance between the updated position and the target position may be determined. This may be performed by the receiver, or by a user who may visually observe the positions through the receiver and determine the distance.

In step 808, whether the updated position is within a threshold distance of the target position is determined. This may be performed by the receiver, or by a user who may visually observe the positions through the receiver and detect whether the updated position is within the threshold distance.

In step 809, if the updated position is within a threshold distance of the target position, a calibration value is stored relating to the updated position. The calibration value may be value relating to a wafer handling robot displacement or a position at the updated position.

For example, the calibration value is a value indicating the updated position of the alignment wafer. The calibration value may be used to position a semiconductor wafer by the wafer handling robot for process by the semiconductor processing tool in the semiconductor processing module. The calibration value may be stored by the receiver, and used to instruct the wafer handling robot to move. The calibration value may be determined by a user and stored by the user in a computer different from the receiver. The calibration value may be store by use of the software to control the wafer handling robot. The user may utilize the calibration value to control the move of the wafer handling robot through a software/firmware. The alignment of the wafer handling robot with respect to the semiconductor processing tool in the semiconductor processing module of the wafer processing system is thus completed by use of the embodiment alignment wafer.

If the updated position is not within the threshold distance of the target position, steps 804 to 807 are iteratively repeated until the updated position is within the threshold distance of the target position.

A wafer manufacturing process may include several individual processes that are performed on the semiconductor wafer using different semiconductor processing tools of one or more different semiconductor processing modules. The method of aligning a wafer handling robot as described above may be used for each of different semiconductor processing modules and/or each of different semiconductor processing tools. Furthermore, the alignment wafer can be moved between separate semiconductor processing modules within the wafer processing system using one or more wafer handling robots, without the need of a user manually moving the alignment wafer.

Figure 9:
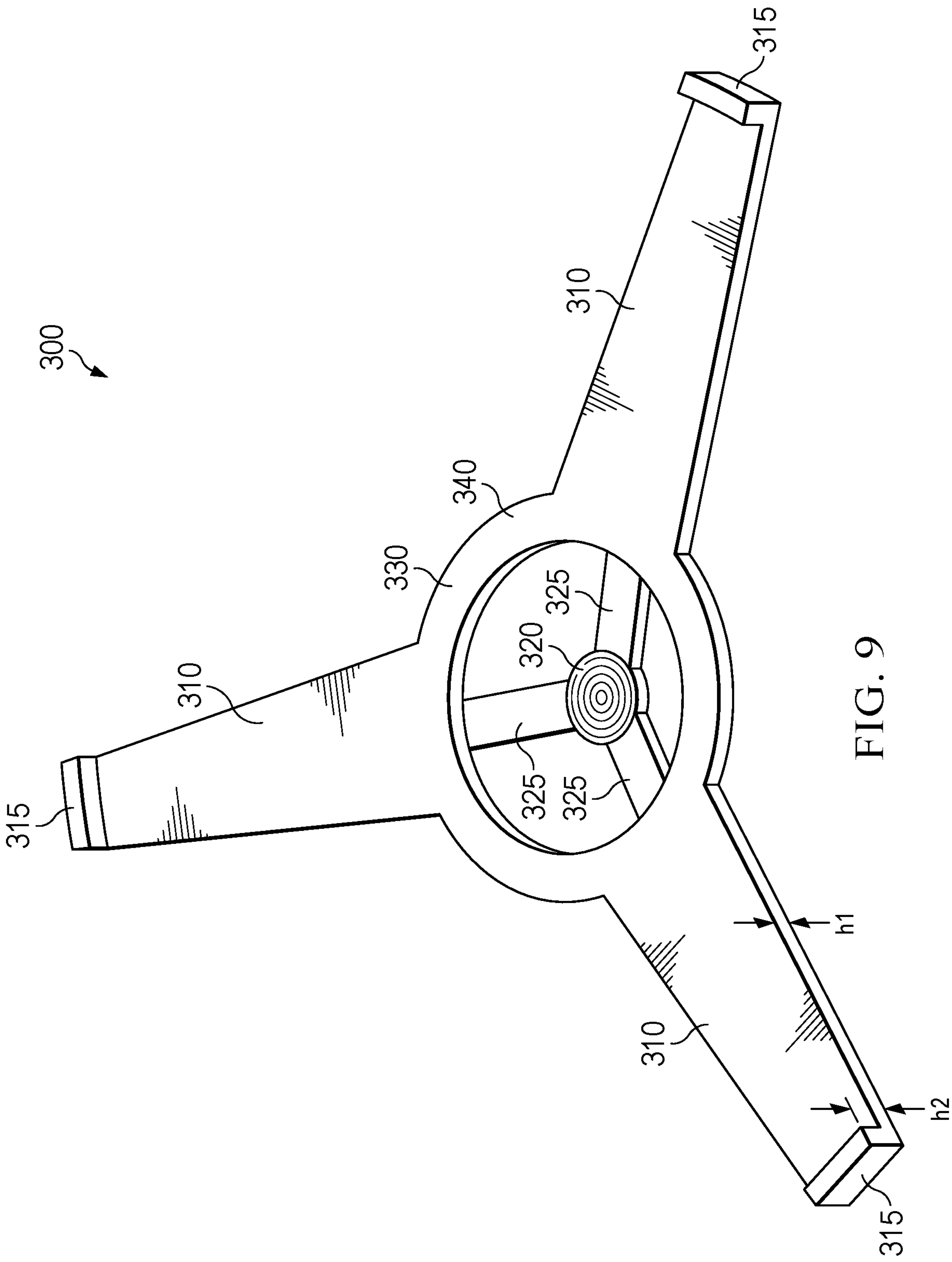
FIG. 9 shows an example frame for calibrating a wafer of an embodiment of the disclosure.
Figure 10A:
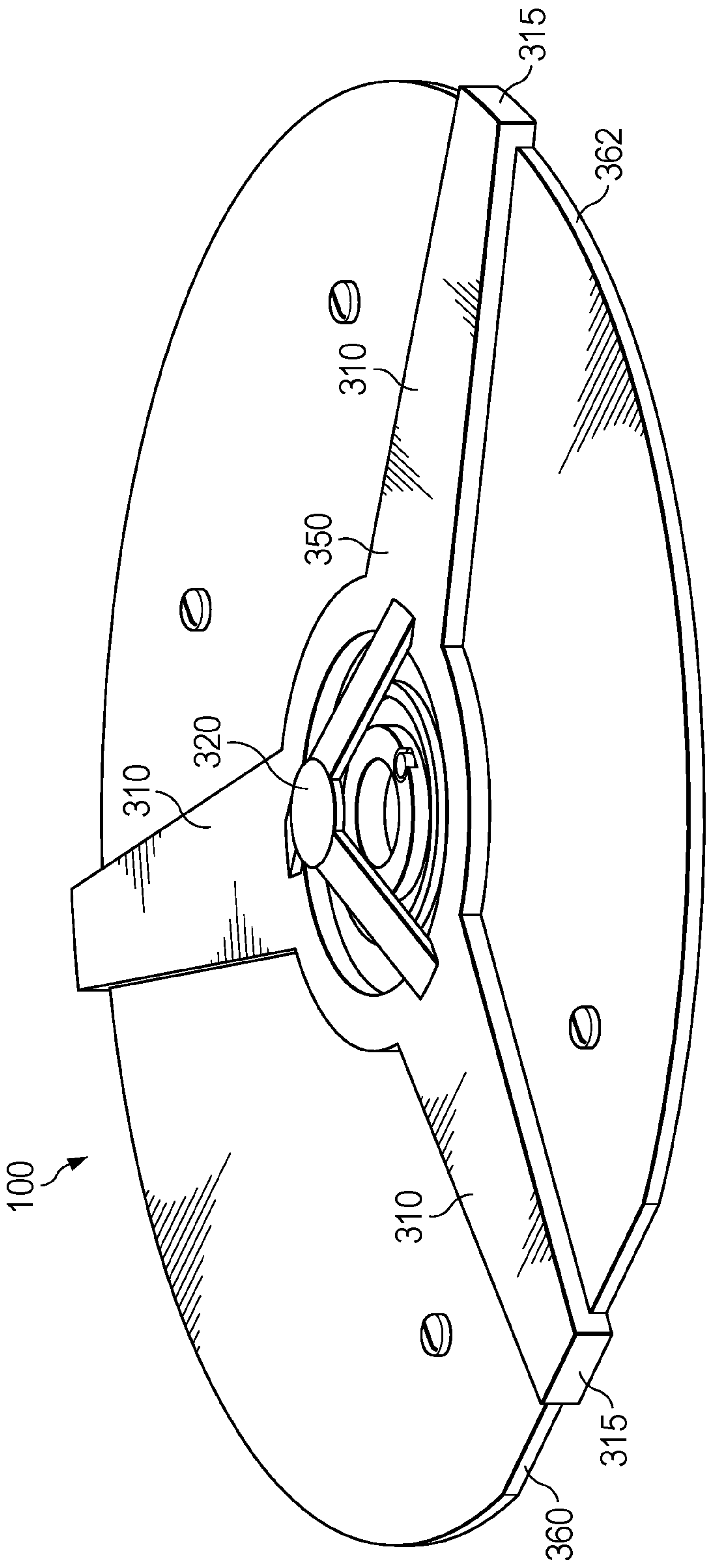
FIGS. 10A and 10B show a wafer of an embodiment of the disclosure held in the frame shown in FIG. 9.

FIG. 9 shows a frame 300 for calibrating a wafer of an embodiment of the disclosure, and FIGS. 10A and 1B show the alignment wafer 100 of an embodiment of the disclosure held in the frame 300 shown in FIG. 9. The frame 300 may also be referred to as a calibration frame 300.

Before use of the alignment wafer 100 in a wafer handling robot, the camera of the alignment wafer 100 may need to be calibrated itself such that the sensor (i.e., the camera) is at the right position and will always image or measure the desired position for robot calibration. This may be done in the process of manufacturing the sensor of the alignment wafer (for example, when attaching the camera, the mirror and the glass reticle with crosshair to ensure that the camera captures an image from the center of the wafer). The camera of the calibration wafer may be calibrated, i.e., the position of the camera may be calibrated, by use of the frame 300 holding the alignment wafer 100. The frame may be formed in various ways, e.g., the frame may be printed using a 3D printer or molded. The frame may be made with PLA (Polylactic acid), other types of plastic, or a metal such as aluminum for increased durability and accuracy.

Referring to FIGS. 9-10, the frame 300 has three flat, radial arms 310 extending from a circular flat base 330. The circular flat base 330 may be in a ring shape as shown. The radial arms 310 extend from the outer edge of the ring shape. The radial arms 310 may be evenly distributed along the circumference of the circular flat base 330. Each of the radial arms 310 has a sidewall 315 extending perpendicularly from the corresponding arm 310. The sidewall 315 is at the distant edge of a corresponding radial arm away from the base 330. The radial arms 310 each extend to a length required for the sidewall 315 to engage with the side/edge of the calibration wafer 100. The sidewalls 315 of the radial arms 310 are in shapes aligned with the edge of the alignment wafer 100 in order to engage with the edge of the alignment wafer 100. For example, as shown, the sidewall 315 of one radial arm may be flat to engage with a flat edge 360 of the alignment wafer 100, and the sidewalls 315 of the other two radial arms 310 are round to engage with the round edge 362 of the alignment wafer 100. The bottom surface of the calibration wafer is placed on a flat and continuous surface 340 of the radial arms 310 and the base 330. The sidewall 315 has a thickness h2 greater than the thickness h1 (between opposing surface 340 and surface 350) of the radial arms 310, such that the calibration wafer is held in place on the frame 300 by the sidewall 315. The thickness h2 may be about the same as the thickness of the substrate of the calibration wafer.

A target 320 is located at a center point of the frame 300; in other words, the distance from the inner surface of the sidewall 315 of each of the arms 310 to the center of the target 320 is equal to the radius of the calibration wafer 100. The target 320 may be suspended, one the side of the surface 350, from the base 330 using a plurality of target suspension members 325 to ensure that a distance between the base 330 and the target 320 is sufficient for the camera of the alignment wafer 100 to focus on the target 320. The plurality of target suspension members 325 are positioned at the surface 350 of the frame 300 opposite to the surface 340. Each of the plurality of target suspension members 325 is connected between the surface 350 and the target 320.

Figure 10B:
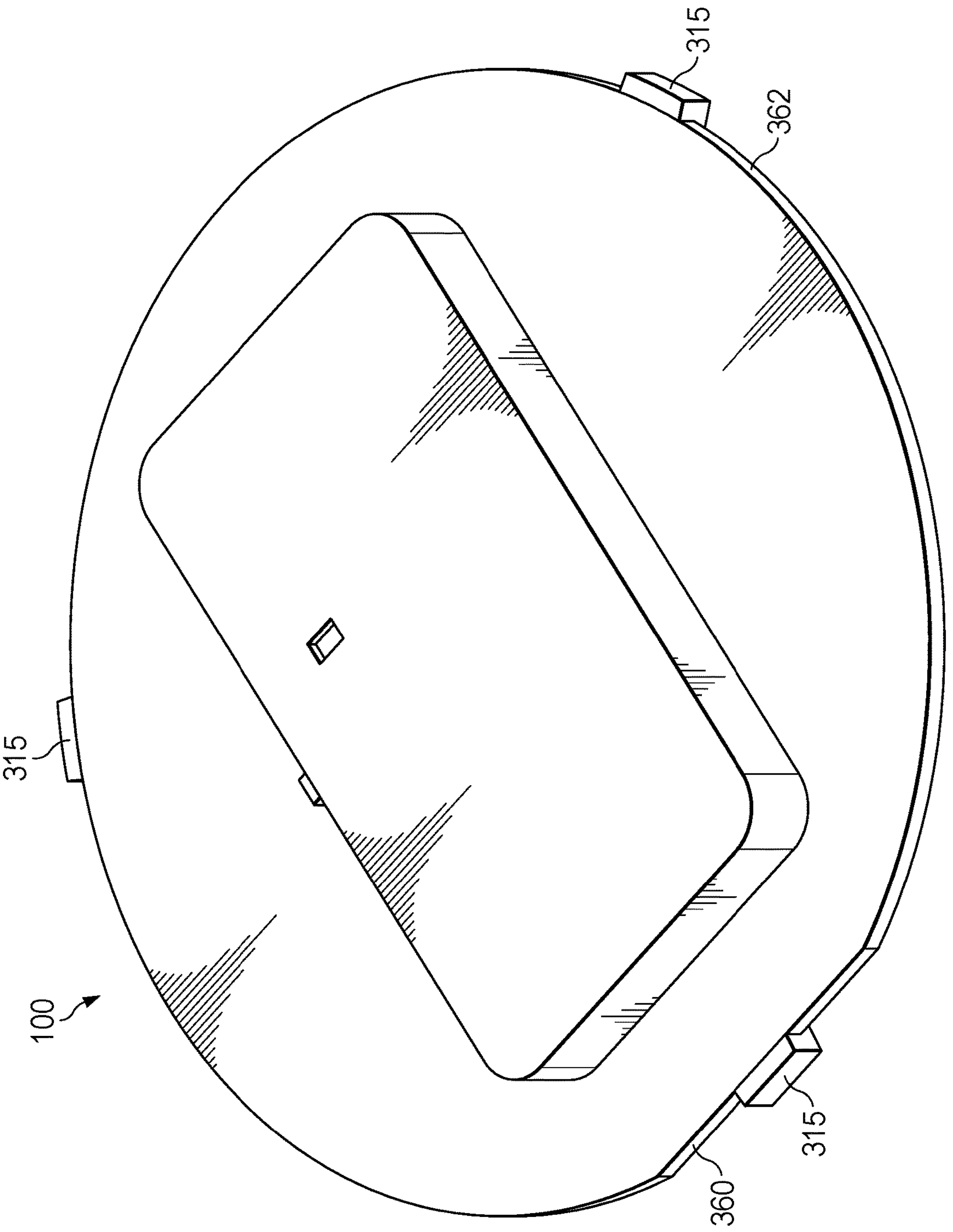

The alignment wafer 100 may be calibrated using the frame 300 as follows:

1. The alignment wafer 100 is placed on the frame 300, as shown in FIGS. 10A and 10B;
2. The camera 160 of the alignment wafer 100 may be unsecured from the substrate wafer 105, for example, by loosening the camera mount pins 170 from the camera mount 140;
3. The positioning of the target 320 relative to the camera 160 may be checked, for example, by viewing a live stream from the camera;
4. The position of the camera mount 140 may be adjusted until the center point of the target 320 is located at the desired position (e.g. the center point) of an image from the camera 160;
5. The camera 160 is secured to the substrate wafer 105, for example, by tightening the camera mount pins 170 to secure the camera mount 140 and the camera 160 in the calibrated position. An adhesive may also be used to secure the camera mount pins 170 and the camera mount 140 in the desired position.

By detecting the position of the target 320 in images taken by the camera 160, the position of the camera may be adjusted until the target 320 in image(s) taken by the camera 160 is located at a desired position in the image(s). The desired position of the target 320 may be a pre-determined position in image(s) taken by the camera 160, which also indicates that the camera 160 taking the image(s) is at a desired position relative to the target, and can be mounted at this desired position. In other words, when the position of the target 320 in the images satisfies a pre-set requirement/criteria, the camera 160 is at the right position satisfying a pre-set location requirement, i.e., the camera 160 is at the right position relative to the target. The purpose is to position the camera 160 at a location on the alignment wafer 100 such that the information captured by the camera 160 via the through-hole 125 may better reflect the position of the alignment wafer 100 in the wafer processing system when the alignment wafer 100 is used to align the robot.

Whilst the use of the calibration frame provides a quick and easy method of accurately positioning the sensor of the calibration wafer, it will be understood that other methods of calibration or locating the center of the calibration wafer using the camera could be used.

Figure 11:
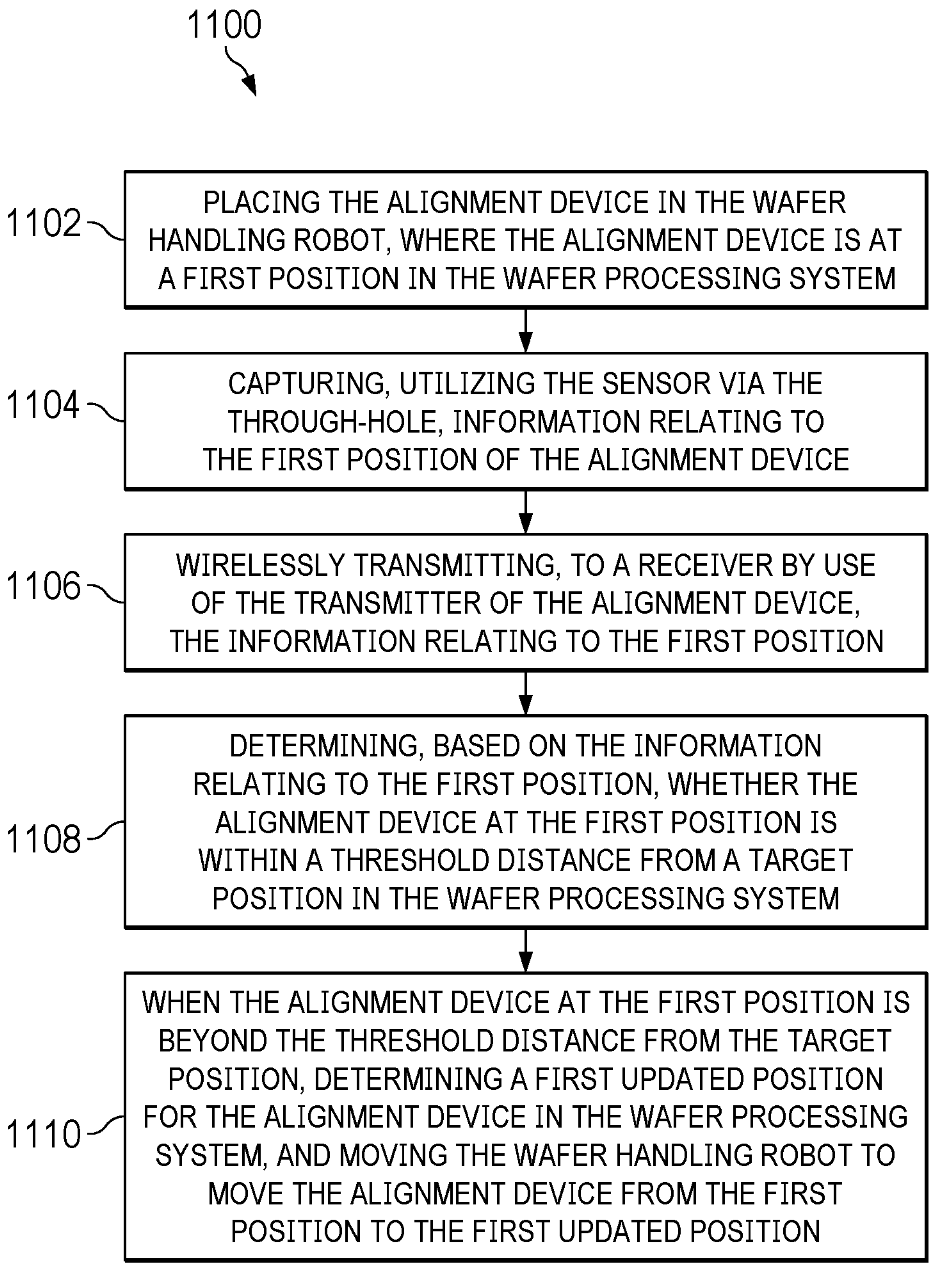
FIG. 11 is a flowchart of a method for aligning a wafer handling robot in a wafer processing system according to an embodiment of the disclosure.

FIG. 11 is a flowchart of a method 1100 for aligning a wafer handling robot in a wafer processing system according to an embodiment of the present disclosure. The method 1100 may be performed using the embodiment alignment wafer/device as discussed above. The alignment device includes a substrate wafer having a through-hole and a sensor mounted on a first surface of the substrate. The method 1100 may include placing the alignment device in the wafer handling robot, where the alignment device is at a first position in the wafer processing system (block 1102). The method 1100 may include capturing, utilizing the sensor via the through-hole, information relating to the first position of the alignment device (block 1104). The method 1100 may further include wirelessly transmitting, to a receiver by use of the transmitter of the alignment device, the information relating to the first position (block 1106). The method 1100 may further include determining (e.g., at the receiver), based on the information relating to the first position, whether the alignment device at the first position is within a threshold distance from a target position in the wafer processing system (block 1108). The method 1100 may also include, when the alignment device at the first position is beyond the threshold distance from the target position, determining (e.g., at the receiver) a first updated position for the alignment device in the wafer processing system, and moving the wafer handling robot to move the alignment device from the first position to the first updated position (block 1110). In some embodiments, when determining that the alignment device at the first position is within the threshold distance from the target position, the information relating to the first position may be stored, and a signal indicating that the alignment of the wafer handling robot is completed may be sent or displayed. The stored information relating to the first position may be used for the wafer handling robot to position wafers to be processed in the wafer processing system.

When the alignment device is moved to the first updated position, the method 1100 may further include the following steps: capturing, utilizing the sensor via the through-hole, information relating to the first updated position of the alignment device; wirelessly transmitting, to the receiver by use of the transmitter of the alignment device, the information relating to the first updated position; determining, e.g., at the receiver, based on the information relating to the first updated position, whether the alignment device at the first updated position is within the threshold distance from the target position in the wafer processing system. When determining that the alignment device at the second updated position is within the threshold distance from the target position, the information relating to the first updated position may be stored, and a signal indicating that the alignment of the wafer handling robot is completed may be sent or displayed. When the alignment device at the first updated position is beyond the threshold distance from the target position, determining, e.g., at the receiver, a second updated position for the alignment device in the wafer processing system, and moving the wafer handling robot to move the alignment device from the first updated position to the second updated position. The method 1100 may continue to check/monitor whether the alignment device at the second updated position is within the threshold distance from the target position in the wafer processing system, and proceed with the alignment similarly to those described above. The stored information relating to a position, e.g., the first position, or the first updated position, etc., may be used as a calibration position for positioning the wafer handling robot, for initially positioning the alignment wafer, and so on.

The following provide some embodiments of the present disclosure.

Embodiment 1: An alignment device for use in a wafer processing system, the device comprising: a substrate configured to be handled by the wafer processing system; a sensor mounted on a first surface of the substrate and configured to capture information relating to a position of the alignment device relative to the wafer processing system; and a transmitter configured to wirelessly transmit the captured information to a receiver.

Embodiment 2: An alignment device according to Embodiment 1, wherein the sensor comprises a camera.

Embodiment 3: An alignment device according to Embodiment 2, wherein the camera is configured to receive radiation from the interior of a wafer processing module of the wafer processing system.

Embodiment 4: An alignment device according to Embodiment 3, wherein the alignment device further comprises a reticle and wherein the camera is configured to capture an image through the reticle.

Embodiment 5: An alignment device according to Embodiment 3 or 4, wherein the alignment device further comprises a reflecting element, and wherein the reflecting element is located on the first surface of the substrate and at an acute angle to the first surface of the substrate, and wherein the reflecting element is configured to direct radiation that is incident on the reflecting element from the interior of the wafer processing module to the camera.

Embodiment 6: An alignment device according to Embodiment 3, 4 or 5, wherein the device further comprises a radiation source configured to be incident on the interior of the wafer processing module.

Embodiment 7: An alignment device according to any of Embodiments 2 to 6, wherein the substrate further comprises a second surface, and wherein the first surface of the substrate and the second surface of the substrate are parallel opposite surfaces.

Embodiment 8: An alignment device according to Embodiment 7, wherein the camera is configured to receive radiation from a substantially central point of the first surface or second surface of the substrate.

Embodiment 9: An alignment device according to Embodiment 7 or 8, wherein the substrate comprises an aperture extending from the first surface to the second surface, and wherein the camera is configured to receive radiation passing through the aperture from the interior of the wafer processing module.

Embodiment 10: An alignment device according to Embodiment 9, wherein the alignment device comprises a protective film formed across the aperture.

Embodiment 11: An alignment device according to Embodiment 10, wherein the reticle is located on the protective film.

Embodiment 12: An alignment device according to Embodiment 9, 10, or 11, wherein the alignment device comprises a light source and wherein the light source comprises one or more lights arranged around the aperture and configured to emit light from the second surface of the substrate.

Embodiment 13: An alignment device according to any preceding Embodiment, wherein the device further comprises a battery mounted on the first surface of the substrate and wherein the battery is configured to power the sensor and the transmitter; and optionally wherein the device comprises a battery indicator configured to indicate a charge level of the battery.

Embodiment 14: An alignment device according to any preceding Embodiment, wherein the device further comprises a cover located over the sensor and the transmitter, and configured to be attached to the substrate.

Embodiment 15: An alignment device according to Embodiment 14, further comprising an antenna configured to wirelessly transmit a signal from the sensor to a receiver, wherein the antenna is located within the cover, or wherein the antenna is located outside of the cover.

Embodiment 16: An alignment device according to Embodiment 14 or 15, wherein the device comprises a battery indicator light configured to indicate a charge level of the battery, and wherein the cover comprises a through-hole substantially aligned with the battery indicator light to allow the battery indicator light to be viewed from an outer surface of the cover.

Embodiment 17: An alignment device according to Embodiment 16, further comprising a plurality of sidewalls surrounding the through-hole of the cover, wherein the sidewalls prevent light from the battery indicator light from reaching the sensor.

Embodiment 18: An alignment device according to any preceding claim, wherein the substrate is formed of Aluminum.

Embodiment 19: A method of manufacturing an alignment device for use in a wafer processing system, the method comprising: forming a substrate configured to be handled by the wafer processing system; forming a sensor on a first surface of the substrate, wherein the sensor is configured to capture information relating to a position of the wafer relative to the wafer processing system; and forming a transmitter configured to wirelessly transmit the captured information to a receiver.

Embodiment 20: A method of aligning a wafer handling robot in a wafer processing module, the method comprising: (i) inserting an alignment device according to any preceding claim into the wafer handling robot; (ii) using the sensor to capture information relating to a first position of the alignment device relative to the wafer processing module; (iii) wirelessly transmitting the captured information, relating to the first position, from the transmitter to a receiver; (iv) moving a position of the wafer handling robot based on the captured information relating to the first position; (v) using the sensor to capture information relating to an updated position of the alignment device relative to the wafer processing module; and (vi) wirelessly transmitting the captured information, relating to the updated position, from the transmitter to a receiver, wherein the alignment device is retained in the wafer handling robot during and between steps (ii) to (vi).

Embodiment 21: A method according to Embodiment 20, wherein the method further comprises: (vii) comparing the updated position with a target position; and (viii) if the updated position is within a threshold distance from the target position, the method further comprises storing a calibration value relating to the updated position.

Embodiment 22: A method according to Embodiment 20 or 21, wherein the method further comprises moving the alignment device from the updated position within the wafer processing module to a position within a further wafer processing module, wherein the alignment device is retained in a wafer handling robot whilst moving between the wafer processing module and the further wafer processing module.

Embodiment 23: A frame for calibrating an alignment device according to any of Embodiment 1 to 18, the frame comprising: a base configured to support the substrate of the alignment device; a plurality of sidewalls configured to engage with an edge of the substrate; and a target configured to be imaged by the sensor of the alignment device.

Embodiment 24: A frame according to Embodiment 23, wherein the target is located at a center point of the frame; and/or wherein the frame comprises a plurality of arms extending from the base to the sidewalls; and/or wherein the frame comprises a plurality of target support members configured to hold the target at a predetermined distance from the base.

Embodiment 25: A method of calibrating an alignment device according to any of Embodiments 1 to 18, using the frame of any of Embodiments 23 or 24, wherein the method comprises: (vi) placing the alignment device in the frame; (vii) capturing information relating the position of the target relative to the sensor of the alignment device; (viii) determining if the sensor of the alignment device is in a correct position relative to the target; (ix) if the sensor of the alignment device is not in a correct position relative to the target, adjusting the position of sensor relative to the substrate of the alignment device, and repeating steps ii) and iii); and (x) if the sensor of the alignment device is in a correct position relative to the target, securing the sensor to the substrate.

Those of ordinarily skilled in the art would understand that in the preceding description and appended claims, positional terms such as 'above', 'overlap', 'under', 'lateral', and so on, are made with reference to conceptual illustrations of an apparatus, such as those showing standard cross-sectional perspectives and those shown in the appended drawings. These terms are used for ease of reference but are not intended to be of limiting nature. These terms are therefore to be understood as referring to a device when in an orientation as shown in the accompanying drawings.

In this disclosure, dimensions are provided merely as indicative examples, and are not intended to be limiting.

Although the disclosure has been described in terms of preferred embodiments as set forth above, it should be understood that these embodiments are illustrative only and that the claims are not limited to those embodiments. Those skilled in the art will be able to make modifications and alternatives in view of the disclosure, which are contemplated as falling within the scope of the appended claims. Each feature disclosed or illustrated in the present specification may be incorporated in the disclosure, whether alone or in any appropriate combination with any other feature disclosed or illustrated herein.

Although the description has been described in detail, it should be understood that various changes, substitutions and alterations can be made without departing from the spirit and scope of this disclosure as defined by the appended claims. Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

What is claimed:

1. An alignment device for use in a wafer processing system, the alignment device comprising:
- a substrate having a through-hole;
- a reticle arranged in the through-hole;
- a sensor mounted on a first surface of the substrate, the sensor configured to capture, via the through-hole, information relating to a position of the alignment device in the wafer processing system; and
- a transmitter mounted on the first surface of the substrate and coupled to the sensor, the transmitter configured to wirelessly transmit the information captured by the sensor.

2. The alignment device according to claim 1, wherein the sensor comprises a camera.

3. The alignment device according to claim 1, further comprising:
- a reflecting element mounted on the first surface of the substrate above the through-hole, the reflecting element being mounted at an angle to the first surface of the substrate such that light incident on the reflecting element through the through-hole is receivable by the sensor.

4. The alignment device according to claim 1, further comprising:

a light source disposed on a second surface of the substrate and around the through-hole, the second surface being opposite to the first surface.

5. The alignment device according to claim 1, further comprising:

a battery mounted on the first surface of the substrate and configured to power the sensor and the transmitter.

6. The alignment device according to claim 1, further comprising:

a cover attached to the first surface of the substrate covering the sensor and the transmitter.

7. The alignment device according to claim 6, further comprising:

a battery indicator light configured to indicate a charge level of a battery of the alignment device; and wherein the cover comprises a through-hole aligned with the battery indicator light such that the battery indicator light is visible from outside of the cover.

8. The alignment device according to claim 7, further comprising:

a sidewall arranged on an inner surface of the cover around the through-hole of the cover, the inner surface of the cover facing the first surface of the substrate.

9. The alignment device according to claim 1, wherein the substrate is made of aluminum.

10. A method of aligning a wafer handling robot in a wafer processing system, the method comprising:

placing an alignment device in the wafer handling robot, the alignment device being at a first position in the wafer processing system, and the alignment device comprising a substrate having a through-hole and a sensor mounted on a first surface of the substrate;

capturing, utilizing the sensor via the through-hole, information relating to the first position of the alignment device;

wirelessly transmitting, to a receiver by use of a transmitter of the alignment device, the information relating to the first position of the alignment device;

determining, based on the information relating to the first position, whether the alignment device at the first position is within a threshold distance from a target position in the wafer processing system, the target position being a predetermined position for placing a wafer; and when the alignment device at the first position is beyond the threshold distance from the target position, determining, based on the first position and the target position, a first updated position for the alignment device in the wafer processing system, the first update position being closer to the target position than the first position to the target position, and moving the wafer handling robot to move the alignment device from the first position to the first updated position.

11. The method according to claim 10, further comprising:

when the alignment device at the first position is within the threshold distance from the target position, storing the information relating to the first position as a calibration value for the wafer handling robot.

12. The method according to claim 10, further comprising:

capturing, utilizing the sensor via the through-hole, information relating to the first updated position of the alignment device in the wafer processing system; and wirelessly transmitting, to the receiver by use of the transmitter of the alignment device, the information relating to the first updated position.

13. The method according to claim 12, further comprising:

determining, based on the information relating to the first updated position, whether the alignment device at the first updated position is within the threshold distance from the target position.

14. The method according to claim 13, further comprising:

when the alignment device at the first updated position is beyond the threshold distance from the target position, determining, based on the first updated position and the target position, a second updated position for the alignment device in the wafer processing system, and moving the wafer handling robot to move the alignment device from the first updated position to the second updated position.

15. The method according to claim 13, further comprising:

when the alignment device at the first updated position is within the threshold distance from the target position, storing the information relating to the first updated position as a calibration value for the wafer handling robot.

16. A frame for calibrating an alignment device, the alignment device comprising a substrate in a circular shape and a sensor mounted on a first surface of the substrate, the substrate having a through-hole in a center of the substrate, and the frame comprising:

a base in a ring-shape;

a plurality of radial arms extending from the base, each of the plurality of radial arms having a sidewall at a distant edge of a corresponding radial arm, and the plurality of radial arms extending to a length such that the sidewall is engageable with an edge of the substrate when the substrate is placed onto the frame with a second surface of the substrate facing a first surface of the frame, wherein the first surface and the second surface of the substrate being opposing surfaces; and a target suspended above a second surface of the frame and aligned with a center point of the frame, the first surface and the second surface of the frame being opposing surfaces, and the target being aligned with the through hole of the substrate such that a position of the camera on the substrate is adjusted based on images of the target taken by the sensor through the through-hole.

17. The frame according to claim 16, further comprising:

a plurality of target support members attached to the second surface of the frame and configured to hold the target at a predetermined distance from the base.

18. The frame according to claim 16, wherein the sidewall has a thickness greater than that of the plurality of radial arms.

19. A method of calibrating the alignment device using the frame according to claim 16, comprising:

i) placing the alignment device on the frame with the second surface of the substrate facing the first surface of the frame;

ii) capturing, using the sensor of the alignment device at a current position on the substrate of the alignment device, information relating to a position of the target;

iii) determining, based on the information captured relating to the position of the target, whether the sensor of the alignment device at the current position satisfies a location requirement;

iv) when the sensor of the alignment device at the current position does not satisfy the location requirement, adjusting the current position of the sensor on the substrate of the alignment device, and repeating steps ii) and iii); and v) when the sensor of the alignment device at the current position satisfies the location requirement, securing the sensor to the substrate of the alignment device at the current position.

20. The alignment device according to claim 1, further comprising:

a protective film formed across the through-hole.

* * * * *